United States Patent
Maruyama et al.

(10) Patent No.: US 11,005,046 B2
(45) Date of Patent: May 11, 2021

(54) CARBON NANOTUBE ARRAY, MATERIAL, ELECTRONIC DEVICE, PROCESS FOR PRODUCING CARBON NANOTUBE ARRAY, AND PROCESS FOR PRODUCING FIELD EFFECT TRANSISTOR

(71) Applicants: THE UNIVERSITY OF TOKYO, Tokyo (JP); DENSO CORPORATION, Kariya (JP)

(72) Inventors: Shigeo Maruyama, Tokyo (JP); Shohei Chiashi, Tokyo (JP); Keigo Ohtsuka, Soka (JP); Taiki Inoue, Tokyo (JP)

(73) Assignees: THE UNIVERSITY OF TOKYO, Tokyo (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/504,882

(22) Filed: Jul. 8, 2019

(65) Prior Publication Data
US 2019/0334091 A1 Oct. 31, 2019

Related U.S. Application Data (62) Division of application No. 15/122,658, filed as application No. PCT/JP2015/055770 on Feb. 27, 2015, now abandoned.

(30) Foreign Application Priority Data

Mar. 1, 2014 (JP) .................................. 2014-040003

(51) Int. Cl.
*C01B 32/168* (2017.01)
*H01L 51/00* (2006.01)
(Continued)

(52) U.S. Cl.
CPC .......... *H01L 51/0048* (2013.01); *B82Y 10/00* (2013.01); *B82Y 30/00* (2013.01);
(Continued)

(58) Field of Classification Search
CPC ............. H01L 51/0558; H01L 51/0048; C01B 32/168; C01B 32/16; C01B 32/154–172;
(Continued)

(56) References Cited

U.S. PATENT DOCUMENTS

2010/0003809 A1   1/2010 Huang
2010/0044679 A1*  2/2010 Buh et al. ........... H01L 51/0048
                                                      257/24
(Continued)

FOREIGN PATENT DOCUMENTS

JP    2005-325020 A    11/2005
JP    2007-31239 A      2/2007
(Continued)

OTHER PUBLICATIONS

Jin, et al., "Using nanoscale thermocapillary flows to create arrays of purely semiconducting single-walled carbon nanotubes," Nature Nanotechnology, published online Apr. 28, 2013 (Year: 2013).*

(Continued)

*Primary Examiner* — Matthew D Matzek
(74) *Attorney, Agent, or Firm* — Sughrue Mion, PLLC (57) ABSTRACT

In order to obtain a carbon nanotube array including no m-CNTs through simple steps using a mechanism that is different from thermocapillary flow, there are provided a process for producing a carbon nanotube array including (A) a step of preparing a carbon nanotube array in which m-CNTs and s-CNTs are horizontally aligned; (B) a step of forming an organic layer on the carbon nanotube array; (C) a step of applying voltage to the carbon nanotube array in a long axis direction of the carbon nanotubes constituting the (Continued)

carbon nanotube array in the air; and (D) a step of removing the organic layer, and a carbon nanotube array obtained by the process.

10 Claims, 3 Drawing Sheets

(51) Int. Cl.
| | |
|---|---|
| *B82Y 30/00* | (2011.01) |
| *H01L 51/05* | (2006.01) |
| *B82Y 10/00* | (2011.01) |
| *H01L 51/56* | (2006.01) |
| *C01B 32/16* | (2017.01) |
| *D04H 1/4242* | (2012.01) |
| *D04H 1/74* | (2006.01) |
| *B82Y 40/00* | (2011.01) |
| *H01L 29/06* | (2006.01) |
| *H01L 29/775* | (2006.01) |

(52) U.S. Cl.
CPC ............ *C01B 32/16* (2017.08); *C01B 32/168* (2017.08); *D04H 1/4242* (2013.01); *D04H 1/74* (2013.01); *H01L 51/0558* (2013.01); *H01L 51/56* (2013.01); *B82Y 40/00* (2013.01); *C01B 2202/08* (2013.01); *H01L 29/0673* (2013.01); *H01L 29/775* (2013.01); *Y10S 977/742* (2013.01); *Y10S 977/842* (2013.01); *Y10S 977/938* (2013.01)

(58) Field of Classification Search
CPC ......... B82Y 10/00; B82Y 30/00; B82Y 40/00; Y10S 977/742; Y10S 977/75–753; Y10S 977/842; Y10S 977/845
USPC ................ 977/742, 750–753, 938, 842, 845; 427/58
See application file for complete search history.

(56) References Cited

U.S. PATENT DOCUMENTS

| | | | |
|---|---|---|---|
| 2011/0081770 A1 | 4/2011 | Tombler, Jr. | |
| 2016/0133843 A1* | 5/2016 | Rogers et al. | H01L 51/0048 257/9 |
| 2017/0077407 A1 | 3/2017 | Maruyama et al. | |

FOREIGN PATENT DOCUMENTS

| | | |
|---|---|---|
| JP | 2008-214142 A | 9/2008 |
| JP | 2010-502548 A | 1/2010 |
| JP | 2010-515283 A | 5/2010 |
| JP | 2010-138015 A | 6/2010 |
| JP | 2010-269979 A | 12/2010 |
| JP | 2011-098876 A | 5/2011 |
| JP | 2011-166070 A | 8/2011 |
| JP | 2011-184225 A | 9/2011 |
| JP | 2012-036041 A1 | 2/2012 |
| JP | 2012-153600 A | 8/2012 |
| JP | 2012-179229 A | 9/2012 |
| JP | 2014-150175 A | 8/2014 |
| WO | 2008/073171 A2 | 6/2008 |
| WO | 2008/075642 A1 | 6/2008 |
| WO | 2009/093773 A1 | 7/2009 |

OTHER PUBLICATIONS

Taiki Inoue et al., "Effect of Gas Pressure on the Density of Horizontally Aligned Single-Walled Carbon Nanotubes Grown on Quartz Substrates", J. Phys. Chem. C, 2013, pp. 11804-11810, vol. 117.

International Search Report for PCT/JP2015/055770 dated Apr. 14, 2015.

Communication dated Feb. 26, 2019, from the Japanese Patent Office in counterpart application No. 2016-506451.

Sung Hun Jin et al., "Using nanoscale thermocapillary flows to create arrays of purely semiconducting single-walled carbon nanotubes", Nature Nanotechnology, May 2013, pp. 347-355, vol. 8.

Keigo Otsuka et al., "Selective Removal of Metallic Single-Walled Carbon Nanotubes Utilizing Thermal Lithography of Molecular Glass Thin Films", Dai 44 Kai Fullerene Nanotube, Graphene Sogo Symposium Koen Yoshishu, Mar. 11, 2013, p. 119.

Shohei Chiasi et al., "Growth of Horizontally Aligned Single-Walled Carbon Nanotubes on the Singular R-Plane (10-11) of Quartz", J. Phys. Chem., C, 2012, pp. 6805-6808, vol. 116.

Nishant Patil et al., "VMR:VLSI-Compatible Metallic Carbon Nanotube Removal for Imperfection-Immune Cascaded Multi-Stage Digital Logic Circuits using Carbon Nanotube FETs", Election Devices Meeting (IEDM), 2009 IEEE International, 2009, pp. 535-538.

Weiwei et al., "General Rules for Selective Growth of Enriched Semiconducting Single Walled Carbon Nanotubes with Water Vapor as in Situ Etchant", J. Am. Chem. Soc. 2012, 134, 140-14026.

Philip G. Collins et al., "Engineering Carbon Nanotubes and Nanotube Circuits Using Electrical Breakdown", Science, Apr. 21, 2001, pp. 706-709, vol. 292.

Yongyi Zhang et al., "Sorting out Semiconducting Single-Walled Carbon Nanotube Arrays by Preferential Destruction of Metallic Tubes Using Xenon-Lamp Irradiation", J. Phys. Chem. C, 2008, pp. 3849-3856, vol. 112.

Ding, et al., "Selective Growth of Well-Aligned Semiconducting Single-Walled Carbon Nanotubes", Nano Letters, vol. 9, No. 2, pp. 800-805, published online Jan. 20, 2009; 6 pages.

Cao, et al., "Arrays of Single-Walled Carbon Nanotubes with Full Surface Coverage for High-Performance Electronics," Nature Nanotechnology, published online Jan. 27, 2013; 7 pages.

Jin, et al., "Using nanoscale thermocapillary flows to create arrays of purely semiconducting single-walled carbon nanotubes," Nature Nanotechnology, published online Apr. 28, 2013 (Year: 2013); 9 pages.

* cited by examiner

CARBON NANOTUBE ARRAY, MATERIAL, ELECTRONIC DEVICE, PROCESS FOR PRODUCING CARBON NANOTUBE ARRAY, AND PROCESS FOR PRODUCING FIELD EFFECT TRANSISTOR

CROSS REFERENCE TO RELATED APPLICATIONS

This application is a divisional of application Ser. No. 15/122,658 filed Aug. 31, 2016, which is a National Stage of International Application No. PCT/JP2015/055770 filed Feb. 27, 2015, and which claims priority based on Japanese Patent Application No. 2014-040003 filed Mar. 1, 2014, the contents of all of which are incorporated herein by reference in their entirety.

TECHNICAL FIELD

The present invention relates to a carbon nanotube array, a material, an electronic device, a process for producing a carbon nanotube array, and a process for producing a field effect transistor.

The present invention particularly relates to a carbon nanotube array in which semiconducting carbon nanotubes are horizontally aligned densely, specifically, at a density of 1 line/μm or more, and a process for producing the same.

The present invention relates to a material formed with the carbon nanotube array, for example, an electronic material, an optical material, or an electrochemical material.

The present invention relates to an electronic device formed with the carbon nanotube array, specifically, a field effect transistor (FET), a solar cell, a chemical sensor, a photosensor, an optical element, or a terahertz sensor.

BACKGROUND ART

A carbon nanotube, particularly, a semiconducting carbon nanotube (hereinafter, referred to as an "s-CNT" in some cases) is expected to be applicable to next-generation devices due to superiority in electronic properties, optical properties, mechanical properties, thermal properties, and the like.

A method for selectively producing an s-CNT has been explored but a method for selectively producing only an s-CNT has not been established yet.

Instead of the method for selectively producing only an s-CNT, a method for producing a carbon nanotube array constituted with only s-CNTs by selectively removing only m-CNTs from a carbon nanotube array having s-CNTs and metallic carbon nanotubes (hereinafter, referred to as "m-CNTs" in some cases) has currently been examined in terms of practicality.

NPL 1 discloses a method of "electrical breakdown". This method is a method of applying voltage to each carbon nanotube of a carbon nanotube array having s-CNTs and m-CNTs in a long axis direction so as to allow a current to flow into only the m-CNTs. The m-CNT in which a current flows can be locally burned out by self Joule heating. However, in this method, the length of the m-CNT that can be removed is 100 nm at most. Therefore, this method has a problem that the method is not applicable to a carbon nanotube array in which the length of each carbon nanotube is long. In addition, in the case in which the method is applied to the carbon nanotube array in which the length of each carbon nanotube is long, there arises a problem that even when the m-CNT is cut, the m-CNT remains after cutting.

NPL 2 discloses a method of using nanoscale thermocapillary flow. In this method, a thin film made of only α,α,α'-tris(4-hydroxyphenyl)-1-ethyl-4-isopropylbenzene is provided on a carbon nanotube array having s-CNTs and m-CNTs. Then, voltage is applied to each carbon nanotube of the carbon nanotube array in the long axis direction so as to allow a current to flow into only the m-CNT. Due to self Joule heating of the m-CNT, the thin film in the vicinity thereof is torn and/or broken by the thermocapillary flow. As a result, the m-CNT is exposed. On the other hand, the s-CNT is present under the thin film. Then, the exposed m-CNT is removed by reactive ion etching (RIE, $O_2/CF_4$). Finally, the thin film is removed and thus a carbon nanotube array including only the s-CNTs is obtained.

In the method disclosed in NPL 2, there is a problem that the step is complicated because it is required to provide a step of removing the m-CNT by reactive ion etching and the like after a step of generating thermocapillary flow.

In the method disclosed in NPL 2, since thermocapillary flow is used, the density of the s-CNTs in the carbon nanotube array is low (1 line/3 μm). Therefore, there is another problem that properties required for an electronic material formed with the carbon nanotube array cannot be obtained.

Further, in the method disclosed in NPL 2, there is still another problem that the material for generating thermocapillary flow is limited to α,α,α'-tris(4-hydroxyphenyl)-1-ethyl-4-isopropylbenzene or the like.

CITATION LIST

Non-Patent Literature

[NPL 1] P. G. Colins et al., Science 292, 706 (2001).
[NPL 2] S. H. Jin et al., Nat. Nanotechnol. 8, 347 (2013)

SUMMARY OF INVENTION

Technical Problem

An object of the present invention is to provide a method for solving the above problems.

Specifically, an object of the present invention is to provide a process for obtaining a carbon nanotube array including no m-CNTs obtained by removing m-CNTs from a carbon nanotube array having s-CNTs and m-CNTs through simple steps using a mechanism that is different from thermocapillary flow.

Another object of the present invention is to provide a carbon nanotube array including no m-CNTs in which the density of s-CNTs is high.

Solution to Problem

The present inventors have found the following inventions.

<1> A carbon nanotube array according to an aspect of the present invention is a carbon nanotube array including no metallic carbon nanotubes in which semiconducting carbon nanotubes are horizontally aligned at a density of 1 line/μm or more.

<2> In the above <1>, a density of the semiconducting carbon nanotubes may be 1,000 lines/μm or more.

<3> In any one of the above <1> and <2>, a length of each semiconducting carbon nanotube of the carbon nanotube array may be 10 µm or more. The length of each semiconducting carbon nanotube may be preferably 100 µm or more and more preferably 1,000 µm or more.

<4> In any one of the above <1> to <3>, in a case of forming a field effect transistor (FET) with the carbon nanotube array, an ON/OFF ratio of the FET may be 10,000 or more. In addition, the ON/OFF ratio of the FET may be preferably 100,000 or more and more preferably 1,000,000 or more.

<5> A material according to an aspect of the present invention is formed with the carbon nanotube array according to any one of the above <1> to <4>. This material may be, for example, an electronic material, an optical material, an electrochemical material, or the like.

<6> An electronic device according to an aspect of the present invention is formed with the carbon nanotube array according to any one of the above <1> to <4>. The electronic device may be, for example, a field effect transistor (FET), a solar cell, a chemical sensor, a photosensor, an optical element, or a terahertz sensor.

<7> A process for producing a carbon nanotube array according to an aspect of the present invention includes: (A) a step of preparing a carbon nanotube array in which metallic carbon nanotubes and semiconducting carbon nanotubes are horizontally aligned; (B) a step of forming an organic layer on the carbon nanotube array; (C) a step of applying voltage to the horizontally aligned carbon nanotube array in a long axis direction of the carbon nanotubes constituting the carbon nanotube array in the air; and (D) a step of removing the organic layer.

<8> In the above <7>, the organic substance in the (B) step may have a thermal diffusion coefficient of $2\times10^{-7}$ m²/s or less. In addition, the thermal diffusion coefficient thereof may be preferably $1\times10^{-7}$ m²/s or less and more preferably $0.2\times10^{-7}$ m²/s or less.

<9> In any one of the above <7> and <8>, the organic layer in the (B) step may be a layer made of only α,α,α'-tris(4-hydroxyphenyl)-1-ethyl-4-isopropylbenzene or a layer made of only poly(methyl methacrylate).

<10> In any one of the above <7> to <9>, the semiconducting carbon nanotubes may be horizontally aligned at a density of 1 line/µm or more. In addition, the semiconducting carbon nanotubes may be horizontally aligned preferably at a density of 3 lines/µm or more, more preferably at a density of 10 lines/µm or more, and most preferably at a density of 30 lines/µm or more.

<11> In any one of the above <7> to <10>, a length of the semiconducting carbon nanotube may be 10 µm or more. The length of the semiconducting carbon nanotube may be preferably 100 µm or more and more preferably 1,000 µm or more.

<12> A process for producing a field effect transistor (FET) according to an aspect of the present invention may be a process using a carbon nanotube array that is produced using the process for producing a carbon nanotube array according to any one of the above <7> to <11>. An ON/OFF ratio of the field effect transistor may be 10,000 or more, preferably 100,000 or more, and more preferably 1,000,000 or more.

Advantageous Effects of Invention

According to the present invention, it is possible to obtain a carbon nanotube array including no m-CNTs by removing m-CNTs from a carbon nanotube array having s-CNTs and m-CNTs through simple steps using a mechanism that is different from thermocapillary flow.

In addition, according to the present invention, it is possible to obtain a carbon nanotube array including no m-CNTs in which the density of s-CNTs is high.

DESCRIPTION OF EMBODIMENTS

Hereinafter, the present invention will be described in detail.

The present invention provides a carbon nanotube array including no metallic carbon nanotubes and a process for producing the same. In addition, the present invention provides a material and an electronic device formed with a carbon nanotube array including no metallic carbon nanotubes.

In the present invention, the expression "including no metallic carbon nanotubes" means that the carbon nanotube array does not have properties of metallic carbon nanotubes. Specifically, "A including no metallic carbon nanotubes" means that the electrical conductivity of "A" does not exhibit metallic properties, more specifically, semiconductor properties.

Hereinafter, a process for producing a carbon nanotube array including no metallic carbon nanotubes and the carbon nanotube array will be sequentially described.

<Process for Producing Carbon Nanotube Array>

In the present invention, a carbon nanotube array including no metallic carbon nanotubes is produced from a carbon nanotube array in which metallic carbon nanotubes and semiconducting carbon nanotubes are horizontally aligned.

The process has the following steps.

That is, the process for producing a carbon nanotube array according to the present invention includes: (A) a step of preparing a carbon nanotube array in which metallic carbon nanotubes and semiconducting carbon nanotubes are horizontally aligned; (B) a step of forming an organic layer on the carbon nanotube array; (C) a step of applying voltage to the horizontally aligned carbon nanotube array in a long axis direction of the carbon nanotubes constituting the carbon nanotube array in the air; and (D) a step of removing the organic layer. After the (C) step is completed, the carbon nanotube array is free from metallic carbon nanotubes.

<<Step (A)>>

Step (A) is a step of preparing a carbon nanotube array in which metallic carbon nanotubes and semiconducting carbon nanotubes are horizontally aligned.

The carbon nanotube array in which metallic carbon nanotubes and semiconducting carbon nanotubes are horizontally aligned can be produced by a conventionally known process. Although the process is not limited to the following processes, for example, a method using a single crystal substrate having an R-cut surface described in WO2011/108545, which partially matches with the process of the present inventors of the present invention, a method using a $SiO_2$ single crystal substrate having a ST-cut surface, a method using a sapphire substrate having an R-cut surface, and a method using single crystal substrate having a step may be used.

The carbon nanotube array to be prepared in Step (A) has metallic carbon nanotubes and semiconducting carbon nanotubes. The carbon nanotube array may include carbon nanotubes having other properties, for example, a carbon nanotube which is a metallic carbon nanotube but has defects and is thereby formed into a semiconductor-like carbon nanotube. However, it is preferable to suppress the amount of the carbon nanotube having other properties contained as much as possible in the case of using an electronic material or the like.

In Steps (B) to (D), which will be described later, the length of each semiconducting carbon nanotube in the carbon nanotube array does not change. Accordingly, the length of each semiconducting carbon nanotube in the carbon nanotube array in Step (A) may be 10 μm or more, preferably 100 μm or more, and more preferably 1,000 μm or more. In Step (A), when the length of each semiconducting carbon nanotube is set to the above length, the carbon nanotube array having the above length can be easily produced. In addition, a material having the carbon nanotube array can be easily produced in large quantity. Further, using the carbon nanotube array, an integrated circuit in which a large number of FETs are also arranged in the axial direction of the array can be produced.

In Steps (B) to (D), which will be described later, particularly, in Step (C), the metallic carbon nanotubes in the carbon nanotube array are removed, but the density of the semiconducting carbon nanotubes does not change. Accordingly, the density of the semiconducting carbon nanotubes in the carbon nanotube array in Step (A) is 1 line/μm or more, preferably 3 lines/μm or more, more preferably 10 lines/μm or more, and more preferably 30 lines/μm or more.

In Steps (A) to (D), a substrate may be provided or may not be provided under the carbon nanotube array. However, from the viewpoint of good handleability in Steps (A) to (D) and ease of easily using the carbon nanotube array obtained after Step (D) is performed for a material, it is preferable that a substrate is provided under the carbon nanotube array.

The substrate may be a substrate (first substrate) used for obtaining a carbon nanotube array in which metallic carbon nanotubes and semiconducting carbon nanotubes are horizontally aligned or may be another substrate (second substrate) that is different from the first substrate. That is, in the case of using the second substrate, the array may be moved onto from the first substrate used for obtaining the carbon nanotube array to the second substrate. As a method for moving the array from the first substrate to the second substrate, methods described in L. Jiao, B. Fan, X. Xian, Z. Wu, J. Zhang, and Z. Liu, J. Am. Chem. Soc. 130, 12612 (2008), P. Zhao, B. Hou, X. Chen, S. Kim, S. Chiashi, E. Einarsson, S. Maruyama, "Investigation of Non-Segregation Graphene Growth on Ni via Isotope-Labeled Alcohol Catalytic Chemical Vapor Deposition", Nanoscale, (2013), 5, 6530-653, and the like may be used. The method is not limited to these methods.

<<Step (B)>>

Step (B) is a step of forming an organic layer on the carbon nanotube array prepared in Step (A) above.

In Step (C), which will be described later, the organic layer exhibits an effect of maintaining a combustion reaction of the metallic carbon nanotube. Since the organic layer more easily burns than the carbon nanotube, the organic layer can support the combustion. It is considered that the combustion reaction of each metallic carbon nanotube is conducted in the following steps while the combustion reaction is supported by combustion of the organic layer. First, the carbon nanotube transports combustion heat at the end portion in the axial direction. The organic layer is heated by the transported combustion heat. Combustion starts in the organic layer of the heated portion by applying the combustion heat. The organic layer in which combustion has started applies the heat to the carbon nanotube again and combustion starts at a portion of the carbon nanotube to which heat is applied. By repeating the above steps, the combustion reaction of each metallic carbon nanotube is maintained.

The organic layer is a layer which exhibits the above effect and as long as an organic substance is used to form the layer, the organic substance is not particularly limited. Only one or two or more organic substances may be used.

As long as the organic layer exhibits the above effect, the layer may be formed on the carbon nanotube array in any form. It is preferable that the organic layer is formed so as to cover the entire carbon nanotube array.

As long as the organic layer exhibits the above effect, the thickness thereof is not particularly limited. For example, the thickness may be 3 to 1,000 nm, preferably 10 to 100 nm and more preferably 20 to 60 nm.

The thermal diffusion coefficient of the organic substance may be $2\times10^{-7}$ m$^2$/s or less, preferably $1\times10^{-7}$ m$^2$/s or less, and more preferably $0.2\times10^{-7}$ m$^2$/s or less.

It is preferable that the organic substance has good heat retention to exhibit the above effect.

The organic layer may be a layer particularly made of only α,α,α'-tris(4-hydroxyphenyl)-1-ethyl-4-isopropylbenzene or a layer made of only poly(methyl methacrylate).

The organic layer varies depending on an organic substance to be used, the molecular weight thereof, and the like. The layer can be obtained by applying a solution of an organic substance to be used so as to cover the entire carbon nanotube array by a conventionally known method. Although the conventional known method is not limited to the following methods, for example, spin coating, heat resistance deposition, and the like may be used.

<<Step (C)>>

Step (C) is a step of applying voltage to the horizontally aligned carbon nanotube array provided with the organic layer obtained in Step (B) above in the long axis direction of the carbon nanotubes constituting the carbon nanotube array in the air. When Step (C) is completed, the carbon nanotube array is free from the metallic carbon nanotubes.

In Step (C), voltage is applied to the carbon nanotube array in which metallic carbon nanotubes and semiconducting carbon nanotube are horizontally aligned. The voltage application direction is a direction along the long axis direction of the carbon nanotubes constituting the carbon nanotube array and it does not matter whether the direction is normal or revered. Since the voltage is applied, an electrode may be appropriately provided.

The voltage is set such that a current flows only into the metallic carbon nanotubes in the carbon nanotube array. Thus, while the metallic carbon nanotubes are heated by self Joule heating, heat generation does not occur in the semiconducting carbon nanotubes.

In the above NPL 1, since the metallic carbon nanotubes are broken due to self Joule heating and further combustion reaction does not proceed, the broken metallic carbon nanotubes remain. However, in Step (C) of the present invention, due to the presence of the organic layer, the effect of maintaining the combustion reaction of the metallic carbon nanotube is exhibited. Due to this effect, it is considered that the metallic carbon nanotubes burn over the entire length and the carbon nanotube array is free from the metallic carbon nanotubes.

The voltage application in Step (C) is performed in the air in contrast with "in vacuum or in an inert gas such as nitrogen" in NPL 2 using "thermocapillary flow". In order to increase the yield rate of the carbon nanotube array including no metallic carbon nanotubes, it is preferable to perform Step (C) in the air having a high steam pressure as much as possible within a range not causing dew condensation.

The voltage application in Step (C) can be completed by monitoring the current at the time of the voltage application. In Step (C), the current is allowed to flow only into the metallic carbon nanotubes. When the whole metallic carbon nanotubes are burned out, the current becomes zero and thus the voltage application can be completed at the time when the current becomes zero or after few minutes has passed from the zero current, that is, Step (C) can be completed.

<<Step (D)>>

Step (D) is a step of removing the organic layer.

Step (D) is dependent on an organic substance to be used for the organic layer. For example, an organic substance may be dissolved and removed by using a solvent for dissolving the organic substance. For example, in the case of using a layer made of only α,α,α'-tris(4-hydroxyphenyl)-1-ethyl-4-isopropylbenzene for the organic layer, as a good solvent for the layer, for example, acetone or the like is preferably used. In the case of using a layer made of only poly(methyl methacrylate) for the organic layer, as a good solvent for the layer, for example, acetone or the like is preferably used.

The process for producing the carbon nanotube array according to the present invention having Steps (A) to (D) may include steps other than Steps (A) to (D) above. Examples of other steps include an observation step with an electron microscope (SEM), and an observation step using Raman spectroscopy.

It is possible to obtain a carbon nanotube array including no metallic carbon nanotubes by performing Steps (A) to (D) of the process for producing the carbon nanotube array according to the present invention. Hereinafter, the carbon nanotube array including no metallic carbon nanotubes will be described.

<Carbon Nanotube Array Including No Metallic Carbon Nanotubes>

The carbon nanotube array of the present invention is a carbon nanotube array including no metallic carbon nanotubes. The semiconducting carbon nanotubes constituting the carbon nanotube array are horizontally aligned at a density of 1 line/μm or more. In addition, the density is preferably 3 lines/μm or more, more preferably 10 lines/μm or more, and still more preferably 30 lines/μm or more.

In contrast, the semiconducting carbon nanotubes are horizontally aligned preferably at a density of 1,000 lines/μm or less, more preferably at a density of 500 lines/μm or less, and most preferably at a density of 250 lines/μm or less. By setting the density of the semiconducting carbon nanotubes to be within the above range, in the case of forming a field effect transistor (FET) with the carbon nanotube array including no metallic carbon nanotubes, electrolytic concentration on the semiconducting carbon nanotubes is easily achieved.

In NPL 1, the broken metallic carbon nanotubes remain. However, in the carbon nanotube array of the present invention, the broken metallic carbon nanotubes do not remain. That is, it is possible to provide a carbon nanotube array including no metallic carbon nanotubes. Herein, it is possible to confirm that the metallic carbon nanotubes "do not remain" from the fact that the metallic carbon nanotubes are not detected in analysis through a "SEM image and the Raman spectroscopy", which will be described later. In NPL 2, since "thermocapillary flow" is used, the density of the semiconducting carbon nanotubes is only about 1 line/3 μm. In contrast, it is possible to increase the density of the semiconducting carbon nanotubes in the carbon nanotube array of the present invention.

The length of each semiconducting carbon nanotube of the carbon nanotube array may be 10 μm or more, preferably 100 μm or more, and more preferably 1,000 μm or more.

In NPL 1, the length of each semiconducting carbon nanotube of the carbon nanotube array including no metallic carbon nanotubes is 100 nm at most. Therefore, it is not possible to obtain a carbon nanotube having the same length as in the carbon nanotube array of the present invention.

When the length of each semiconducting carbon nanotube of the carbon nanotube array is set as described above, a material having the carbon nanotube array can be easily produced in a large quantity. Further, when the carbon nanotube array is used, an integrated circuit in which a large number of FETs are also arranged in the axial direction of the array can be produced.

The carbon nanotube array of the present invention is free from metallic carbon nanotubes. Therefore, in the case of forming a field effect transistor (FET) with the carbon nanotube array, the ON/OFF ratio of the FET may be 10,000 or more, preferably 100,000 or more, and more preferably 1,000,000 or more.

<Material and Electronic Device Having Carbon Nanotube Array>

The material of the present invention has the above-described carbon nanotube array. Although the material is not limited to the following examples, examples thereof include an electronic material, an optical material, or an electrochemical material.

The electronic device of the present invention has the above-described carbon nanotube array. Although the electronic device is not limited to the following examples, examples thereof include a field effect transistor (FET), a solar cell, a chemical sensor, a photosensor, an optical element, or a terahertz sensor.

Hereinafter, although the present invention is further described in detail based on examples, the present invention is not limited to the examples.

EXAMPLES

Example 1

<a. Horizontally Aligned Carbon Nanotube Array Having s-CNTs and m-CNTs>

According to methods described in WO2011/108545, S. Chiashi, H. Okabe, T. Inoue, J. Shiomi, T. Sato, S. Kono, M. Terasawa, S. Maruyama*, "Growth of Horizontally Aligned Single-Walled Carbon Nanotubes on the Singular R-Plane (10-11) of Quartz", J. Phys. Chem. C, (2012), 116, 6805-6808, and T. Inoue, D. Hasegawa, S. Badar, S. Aikawa, S.

Chiashi, S. Maruyama, "Effect of Gas Pressure on the Density of Horizontally Aligned Single-Walled Carbon Nanotubes Grown on Quartz Substrates", J. Phys. Chem. C, (2013), 117, (22), 11804-11810, a horizontally aligned carbon nanotube array having s-CNTs and m-CNTs was prepared.

Specifically, using a crystal substrate having an r-cut surface (manufactured by Hoffman Materials Inc.), a resist pattern was formed on the substrate by photolithography. A catalyst was deposited on the entity of a substrate provided with a resist by vacuum deposition and then the resist was removed so that a catalyst (Fe metal) pattern was formed on the substrate.

The substrate having the catalyst (Fe metal) pattern was used to obtain a horizontally aligned carbon nanotube array having s-CNTs and m-CNTs by an alcohol CVD method.

The details will be described below. First, the substrate having the catalyst (Fe metal) pattern was placed in a chamber and the inside of the chamber was evacuated. Then, an Ar gas was allowed to flow at a flow rate of 300 sccm for 5 minutes. Next, an $Ar/H_2$ mixed gas was allowed to flow at a flow rate of 300 sccm, and the pressure in the chamber was set to 40 kPa. Further, the temperature in the chamber was increased to 800° C. for 30 minutes and the temperature was maintained for 10 minutes. The inside of the chamber was evacuated again while maintaining the temperature. Then, ethanol as a carbon source was allowed to flow at a flow rate of 50 sccm, an $Ar/H_2$ mixed gas for adjusting the flow rate was allowed to flow at a flow rate of 500 sccm, and the pressure was set to 1.4 kPa. After 15 minutes had passed, a horizontally aligned carbon nanotube array was synthesized.

The obtained horizontally aligned carbon nanotube array has s-CNTs and m-CNTs both horizontally aligned. When the length of each carbon nanotube of the horizontally aligned carbon nanotube array was observed with an electron microscope (SEM), the average length thereof was 30 μm. In addition, the density of the horizontally aligned s-CNTs was 1 to 4 lines/μm.

<b. Transfer of Horizontally Aligned Carbon Nanotube Array to p-Type Si Substrate>

The horizontally aligned carbon nanotube array formed on the above-described crystal substrate having an r-cut surface was transferred to a p-type Si substrate via poly (methyl methacrylate) (PMMA).

Specifically, an anisole solution (10 wt %) of PMMA was applied on the horizontally aligned carbon nanotube array formed on the above-described crystal substrate having an r-cut surface by spin coating and a PMMA film was formed on the horizontally aligned carbon nanotube array. Next, the crystal substrate having the horizontally aligned carbon nanotube array and provided with the PMMA film was immersed in a 1 M aqueous potassium hydroxide solution. Then, the immersion state was maintained for a while, and then the PMMA film was peeled off in the aqueous solution. As a result, the horizontally aligned carbon nanotube array was transferred onto the PMMA film. Then, the obtained PMMA film was attached to a p-type Si substrate such that the side of the obtained PMMA film having the horizontally aligned carbon nanotube array was brought into contact with the p-type Si substrate. Thereafter, the PMMA film was removed with acetone. Further, the horizontally aligned carbon nanotube array was transferred to the p-type Si substrate by annealing at 350° C. for 3 hours in vacuum.

When the horizontally aligned carbon nanotube array on the p-type Si substrate was observed with an SEM, the carbon nanotube array exhibited the same properties before being transferred. In addition, when the carbon nanotube array was observed with an SEM, the average length of each carbon nanotube had the same value before being transferred, and the density of the horizontally aligned s-CNTs had the same value before being transferred.

<c. Arrangement of Electrode and Measurement of ON/OFF Ratio of Field Effect Transistor (FET)>

Electrodes were arranged on the horizontally aligned carbon nanotube array provided on the obtained p-type Si substrate. The electrode is used for the following reasons. First, the electrode is used as an electrode (source electrode or drain electrode) of a field effect transistor (FET). In the case of removing the m-CNTs, the electrode is also used as an electrode used for voltage application when the m-CNTs are removed.

The electrodes were provided on the side of the p-type Si substrate having the horizontally aligned carbon nanotube array so as to be orthogonal to each carbon nanotube of the horizontally aligned carbon nanotube array in the long axis direction. The electrodes arranged as described above respectively function as a source electrode and a drain electrode in the FET.

More specifically, Ti/Pd (5/50 nm) was used for an electrode metal and a resist patterned into an electrode having a desired shape by photolithography. The substrate having the resist was placed in a film forming chamber and plasma was generated under the conditions of 0.2 Pa, an Ar gas flow rate of 10 sccm, and an output of 100 W. Thus, electrodes were provided on the substrate. In addition, an electrode which functions as a gate electrode in the FET was also provided on the side of the p-type Si substrate not having the horizontally aligned carbon nanotube array.

<<c-1. Measurement of ON/OFF Ratio in the Case of Forming Field Effect Transistor (FET) Using Carbon Nanotube Array Having m-CNTs and s-CNTs>>

The ON/OFF ratio in the case of forming a FET with the carbon nanotube array having m-CNTs and s-CNTs and provided with the electrodes was measured. The result is indicated by "Before" of FIG. 1.

Figure 1:
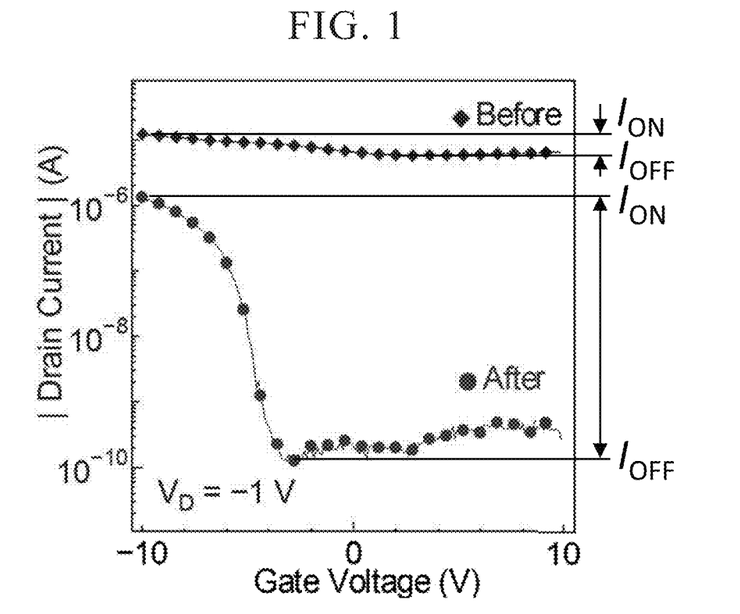
FIG. 1 is a graph showing the ON/OFF ratio of a FET using a carbon nanotube array before a series of steps of applying voltage and removing a film are performed ("Before") and after the steps are performed ("After").

From "Before" of FIG. 1, it is found that the ON/OFF ratio is 1 order. From the result, it is found that the carbon nanotube array includes m-CNTs and thus a short circuit occurs due to the m-CNTs.

<d. Formation of Layer Made of α,α,α-Tris(4-Hydroxyphenyl)-1-Ethyl-4-Isopropylbenzene>

A layer made of α,α,α-tris(4-hydroxyphenyl)-1-ethyl-4-isopropylbenzene (represented by the following Formula (I)) was formed on the carbon nanotube array having m-CNTs and s-CNTs provided with the electrodes by vacuum deposition, which was obtained in the above <c.>.

Specifically, the substrate obtained in the above <c.> was arranged on a stage. A sample of α,α,α-tris(4-hydroxyphenyl)-1-ethyl-4-isopropylbenzene was placed on a tungsten boat connecting between the electrodes. The stage and the boat were covered with the chamber and the inside of the chamber was evaluated to $2.0 \times 10^{-3}$ Pa using a rotary pump and an oil diffusion pump. Then, voltage was applied between the electrodes, a current of about 20 A was allowed to flow into the boat, and the sample was evaporated to be deposited on the substrate. It was confirmed that the film thickness was 60 nm (0.06 μm) with a crystal vibrator arranged in the chamber.

[Chem. 1]

<e. Voltage Application>

Voltage was applied to the carbon nanotube array having m-CNTs and s-CNTs, provided with the electrodes, and obtained in the above <d.> in the air.

Figure 2:
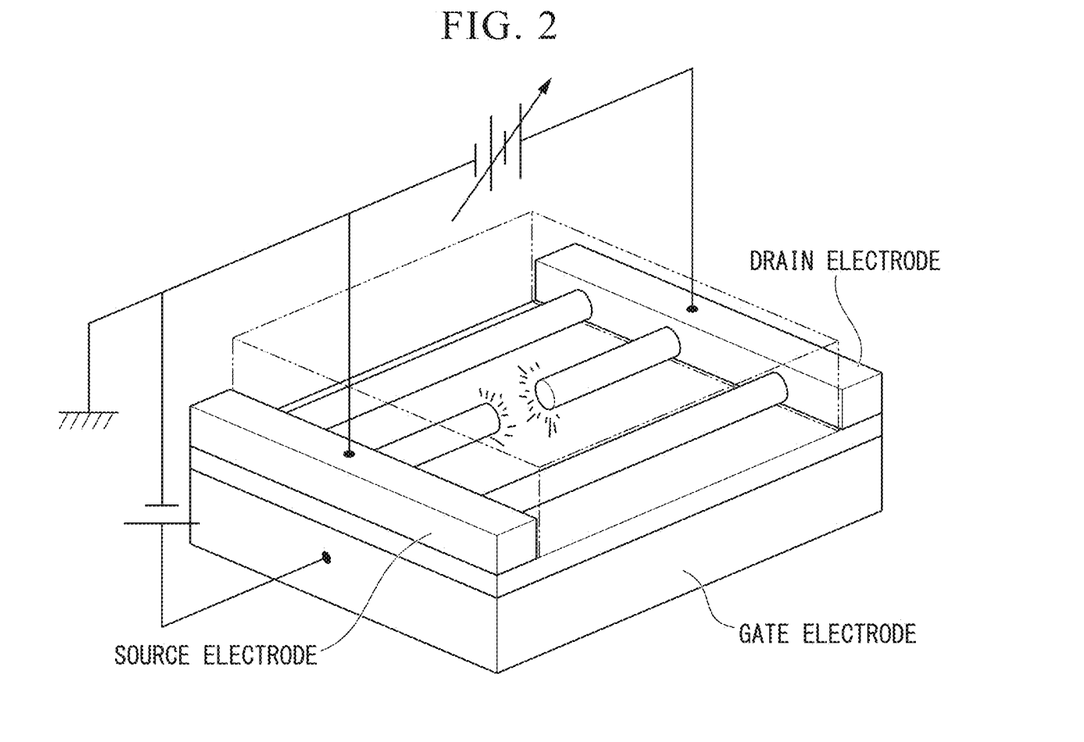
FIG. 2 is a schematic view when voltage is applied to a carbon nanotube array including m-CNTs and s-CNTs.

Specifically, as shown in FIG. 2, one of the electrodes provided on the carbon nanotube array having m-CNTs and s-CNTs was set to a source electrode and the other one was set to a drain electrode. The source electrode was grounded and a drain voltage was applied such that a current flows from the drain electrode to the source electrode. As a gate voltage, while setting a direction in which the current flows from the gate electrode to the source electrode as a positive direction, +10 V was applied. A distance between the drain electrode and the source electrode was 16.4 µm.

The drain voltage was applied at a voltage increase rate of 0.67 V/min, the current accompanying the voltage application was measured and after about 1 minute had passed from the time when the current value becomes zero, the voltage application was terminated. The voltage at the time of termination was about 40 V.

<f. Removal of Layer Made of α,α,α-Tris(4-Hydroxyphenyl)-1-Ethyl-4-Isopropylbenzene>

The layer made of α,α,α-tris(4-hydroxyphenyl)-1-ethyl-4-isopropylbenzene on the substrate obtained in the above <e.> was removed with acetone.

Specifically, the substrate obtained in the above <e.> was immersed in acetone for several minutes and then rinsed with isopropanol and distilled water. Thereafter, the layer made of α,α,α-tris(4-hydroxyphenyl)-1-ethyl-4-isopropylbenzene was removed by drying the substrate.

<g. Carbon Nanotube Array Obtained in Above f. And Measurement of ON/OFF Ratio in the Case of Forming FET Using Same>

The substrate having the carbon nanotube array obtained in the above <f.> is provided with a gate electrode, a source electrode, and a drain electrode. The ON/OFF ratio of the FET having the carbon nanotube array was measured. The result is indicated by "After" in FIG. 1.

From "After" in FIG. 1, it is found that the ON/OFF ratio is $10^4$ order. From the result, the carbon nanotube array is free from m-CNTs and made up of only s-CNTs.

In addition, the carbon nanotube array obtained in the above <f.> was compared with the carbon nanotube array obtained before voltage application in the above <e.>. When comparing the carbon nanotube arrays, SEM images and Raman spectroscopy were used. The results are shown in FIGS. 3 and 4, respectively.

<<SEM Image>>

Figure 3:
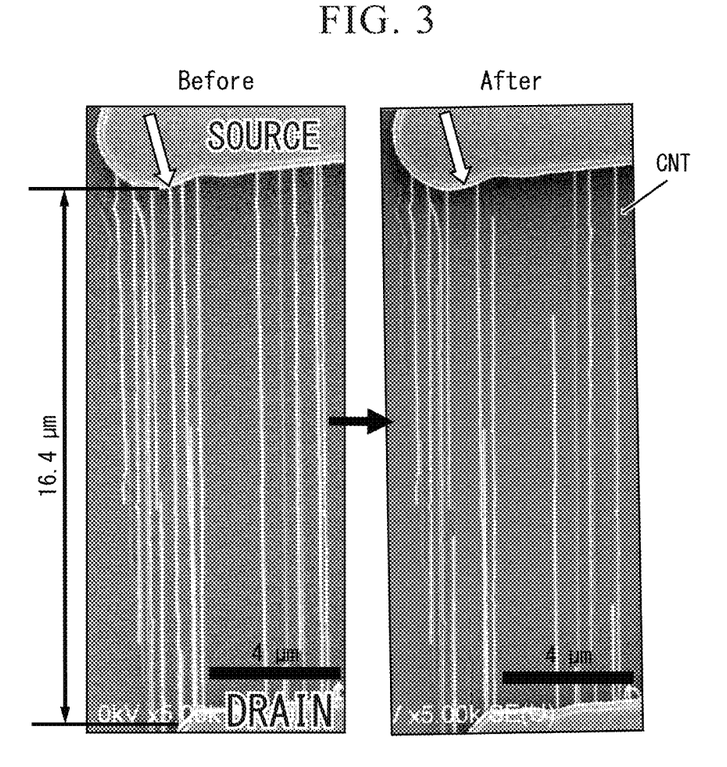
FIG. 3 shows SEM images of the carbon nanotube array before a series of steps of applying voltage and removing a film are performed ("Before") and after the steps are performed ("After").
Figure 4:
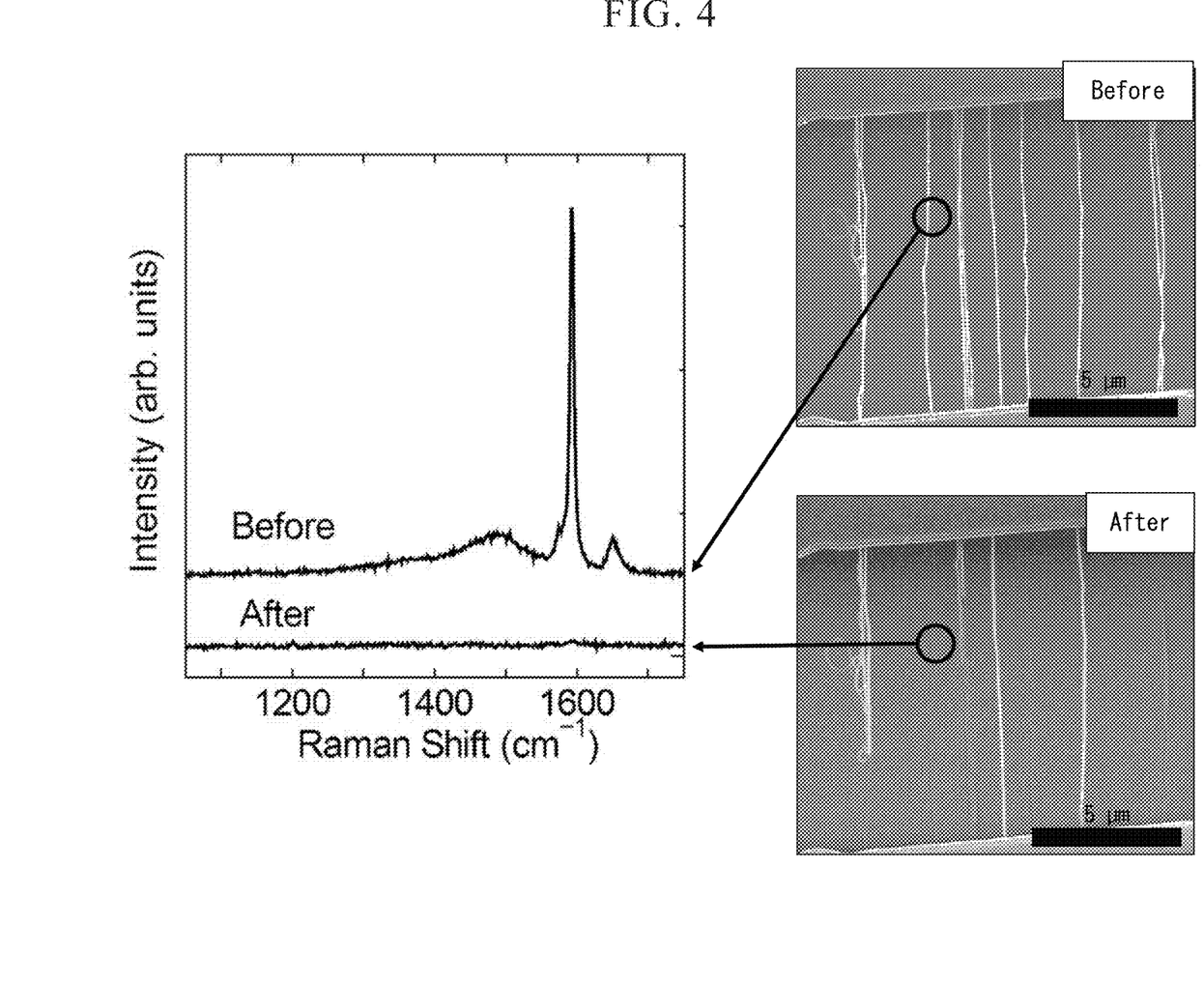
FIG. 4 shows SEM images of the carbon nanotube array before a series of steps of applying voltage and removing a film are performed ("Before") and after the steps are performed ("After") and a graph showing measurement results of spots shown in the SEM images using Raman spectroscopy.

FIG. 3 shows SEM images in which the carbon nanotube array obtained in the above <f.> (indicated by "After") is compared with the carbon nanotube array obtained before voltage application in the above <e.> (indicated by "Before"). From the SEM images, it is found that the m-CNT present within a distance of 1 µm between s-CNTs is removed. From the result, it is found that the density of the s-CNTs of the carbon nanotube array obtained in the above <f.> is 1 line/µm.

<<SEM Image and Raman Spectroscopy>>

FIG. 4 shows SEM images, that is, SEM images of the carbon nanotube array obtained in the above <f.> (indicated by "After") on the right side and the carbon nanotube array obtained before voltage application in the above <e.> (indicated by "Before") are shown on the right side and results of measuring Raman scattering of spots shown in the SEM images by Raman spectroscopy ("After" and "Before" are the same as described above) on the left side.

From the measurement results shown in FIG. 4 by the Raman spectroscopy, it is found that in the carbon nanotube array obtained in the above <f.> (indicated by "After"), the peak in a range of 1,500 to 1,650 $cm^{-1}$ is not observed. In addition, it is found that CNTs are not present in the corresponding spot from the SEM image. From these results, it is found that the carbon nanotube array obtained from the above <f.> (indicated by "After") is free from m-CNTs.

From the results of the ON/OFF ratio of the FET in the above <g.>, and SEM images, and Raman spectroscopy, it is found that the carbon nanotube array obtained in the above <f.> is free from m-CNTs. In the above <f.>, the layer made of α,α,α-tris(4-hydroxyphenyl)-1-ethyl-4-isopropylbenzene is simply removed. Therefore, it is found that at the time when voltage application is terminated in the above <e.>, the carbon nanotube array is free from m-CNTs.

It is found that the carbon nanotube array obtained in the above <f.> is useful as a FET from the result of the ON/OFF ratio of the FET.

Example 2

<a.> to <g.> in Example 1 were performed except that instead of <d. Formation of Layer Made of α,α,α-Tris(4-Hydroxyphenyl)-1-Ethyl-4-Isopropylbenzene> in Example 1, <d'. Formation of Layer made of PMMA> was used and instead of <f. Removal of Layer Made of α,α,α-Tris(4-Hydroxyphenyl)-1-Ethyl-4-Isopropylbenzene>, <f'. Removal of Layer Made of PMMA> was used.

<d'. Formation of Layer Made of PMMA>

A 1 wt % anisole solution of PMMA was prepared. The solution was applied to the carbon nanotube array having m-CNTs and s-CNTs by spin coating and then the solution was removed at 120° C. Thus, a layer made of PMMA was formed on the carbon nanotube array having m-CNTs and s-CNTs. When the thickness of the layer was measured using a stylus type surface profiler (Dektak XT, manufactured by ULVAC, Inc.), it was confirmed that the thickness is 20 to 50 nm.

<f'. Removal of Layer Made of PMMA>

The layer made of PMMA on the substrate obtained in the above <e.> was removed with acetone.

Specifically, the substrate obtained in the above <e.> was immersed in acetone for several minutes and rinsed with isopropanol and distilled water. Thereafter, the layer made of PMMA was removed by drying the substrate.

From the results of the ON/OFF ratio measurement of the FET (10,000), SEM image observation, and AFM measurement (none of these are shown in the drawing), it was found that the carbon nanotube array obtained in Example 2 is free from m-CNTs similar to Example 1. In addition, it was found that the carbon nanotube array obtained in Example 2 was useful as a FET from the results of the ON/OFF ratio of the FET.

The invention claimed is:

1. A process for producing a carbon nanotube array comprising:
   (A) a step of preparing a carbon nanotube array in which metallic carbon nanotubes and semiconducting carbon nanotubes are horizontally aligned;
   (B) a step of forming an organic layer on the carbon nanotube array;
   (C) a step of applying voltage to the horizontally aligned carbon nanotube array in a long axis direction of the carbon nanotubes constituting the carbon nanotube array in air to thereby burn out a plurality of the metallic carbon nanotubes; and
   (D) a step of removing the organic layer,
   wherein the air in the (C) step comprises steam.

2. The process for producing a carbon nanotube array according to claim 1,
   wherein a plurality of whole metallic carbon nanotubes are burned out in the (C) step.

3. The process for producing a carbon nanotube array according to claim 1,
   wherein reactive ion etching is not performed between the (C) step and the (D) step.

4. The process for producing a carbon nanotube array according to claim 3,
   wherein the organic substance in the (B) step has a thermal diffusion coefficient of $2\times10^{-7}$ m$^2$/s or less.

5. The process for producing a carbon nanotube array according to claim 3,
   wherein the organic layer in the (B) step is a layer made of only α,α,α'-tris(4-hydroxyphenyl)-1-ethyl-4-isopropylbenzene or a layer made of only poly(methyl methacrylate).

6. The process for producing a carbon nanotube array according to claim 3,
   wherein the semiconducting carbon nanotubes are horizontally aligned at a density of 1 line/μm or more.

7. The process for producing a carbon nanotube array according to claim 3,
   wherein a length of the semiconducting carbon nanotube is 10 μm or more.

8. A process for producing a field effect transistor (FET) using a carbon nanotube array that is produced using the process for producing a carbon nanotube array according to claim 3,
   wherein an ON/OFF ratio is 10,000 or more.

9. The process for producing a carbon nanotube array according to claim 3,
   wherein reactive ion etching is not performed to remove the metallic carbon nanotubes from the nanotube array.

10. The process for producing a carbon nanotube array according to claim 3,
    wherein the (D) step comprises dissolving the organic layer with an organic solvent.

* * * * *